United States Patent
Yang et al.

(10) Patent No.: US 9,618,540 B2
(45) Date of Patent: Apr. 11, 2017

(54) CURRENT SENSING MODULE AND POWER CONVERSION APPARATUS AND ELECTRONIC APPARATUS USING THE SAME

(71) Applicants: Muh-Rong Yang, Taipei (TW); Well-Chen Chua, Taipei (TW); Mao-Chuan Chien, New Taipei (TW); Chi-Chien Lin, Keelung (TW)

(72) Inventors: Muh-Rong Yang, Taipei (TW); Well-Chen Chua, Taipei (TW); Mao-Chuan Chien, New Taipei (TW); Chi-Chien Lin, Keelung (TW)

(73) Assignee: Midastek Microelectronic Inc., Taipei (TW)

( * ) Notice: Subject to any disclaimer, the term of this patent is extended or adjusted under 35 U.S.C. 154(b) by 117 days.

(21) Appl. No.: 14/829,655

(22) Filed: Aug. 19, 2015

(65) Prior Publication Data
US 2016/0344290 A1    Nov. 24, 2016

(30) Foreign Application Priority Data
May 22, 2015    (TW) .............................. 104116514 A

(51) Int. Cl.
*H02M 3/15*    (2006.01)
*G01R 15/14*    (2006.01)
(Continued)

(52) U.S. Cl.
CPC ....... *G01R 15/146* (2013.01); *G01R 19/0092* (2013.01); *H02M 3/156* (2013.01);
(Continued)

(58) Field of Classification Search
CPC ......... H02M 2001/0009; H02M 3/156; H02M 3/158; H02M 3/1588
(Continued)

(56) References Cited

U.S. PATENT DOCUMENTS

| | | | |
|---|---|---|---|
| 5,084,633 | A | 1/1992 | Izadinia |
| 5,097,403 | A | 3/1992 | Smith |

(Continued)

FOREIGN PATENT DOCUMENTS

TW    I404316    8/2013

OTHER PUBLICATIONS

"Office Action of Taiwan Counterpart Application", issued on Jan. 6, 2017, p. 1-p. 3.

*Primary Examiner* — Timothy J Dole
*Assistant Examiner* — Ishrat Jamali
(74) *Attorney, Agent, or Firm* — Jianq Chyun IP Office

(57) ABSTRACT

A current sensing module and a power conversion apparatus and an electronic apparatus using the same are provided. The current sensing module is suitable for detecting a first load current flowing through a first load. The current sensing module includes a sampling stage circuit and an output stage circuit. The sampling stage circuit couples across the first load and selectively exchanges coupling nodes between the sampling stage circuit and the first load by a multiplex switching means, so as to sample the first load current flowing along a first direction or a second direction, and thus generate a sampling signal. The output stage circuit is coupled to the sampling stage circuit and switches coupling nodes between the output stage circuit and the output terminal of the sampling stage circuit, so as to generate a current indication signal indicating the magnitude of the first load current according to the sampling signal.

23 Claims, 5 Drawing Sheets

(51) Int. Cl.
  *G01R 19/00* (2006.01)
  *H02M 3/158* (2006.01)
  *H02M 3/156* (2006.01)
  *H02M 1/00* (2006.01)

(52) U.S. Cl.
  CPC ......... *H02M 3/158* (2013.01); *H02M 3/1588* (2013.01); *H02M 2001/0009* (2013.01)

(58) Field of Classification Search
  USPC .................................................. 320/119, 122
  See application file for complete search history.

(56) References Cited

U.S. PATENT DOCUMENTS

| | | | | |
|---|---|---|---|---|
| 5,818,201 | A * | 10/1998 | Stockstad | H02J 7/0016 320/116 |
| 2006/0220459 | A1 | 10/2006 | Kulasekeram | |
| 2010/0194359 | A1* | 8/2010 | Notman | H02M 3/1588 323/267 |
| 2013/0063113 | A1 | 3/2013 | Couleur et al. | |
| 2013/0151825 | A1* | 6/2013 | Huynh | H02M 1/08 713/1 |

* cited by examiner

Boost mode

Buck mode

CURRENT SENSING MODULE AND POWER CONVERSION APPARATUS AND ELECTRONIC APPARATUS USING THE SAME

CROSS REFERENCE TO RELATED APPLICATION

This application claims the priority benefit of Taiwan application Ser. No. 104116514, filed on May 22, 2015. The entirety of the above-mentioned patent application is hereby incorporated by reference herein and made a part of specification.

BACKGROUND OF THE INVENTION

Field of the Invention

The invention relates to a technique for detecting circuit characteristics and an application thereof, and particularly relates to a current sensing module and a power conversion apparatus and an electronic apparatus using the same.

Description of Related Art

In a current sensing module of a general electronic circuit, an operational amplifier is generally used to detect a signal on a specific node, and then the detected signal is amplified or modulated for converting into a signal format defined by the system, such that the signal can be used to indicate a magnitude of a current flowing through the specific node.

However, in the conventional current sensing module, if an alternating current (AC) signal is required to be processed, a designer has to add an additional negative power supply circuit and a bias circuit in the circuit, such that a bi-directional current signal can be converted into a direct current (DC) signal for providing to a control circuit, and the control signal can determine the detected signal to implement subsequent control operation.

Particularly, in design of a power conversion apparatus, in order to achieve a stable and good control, a common method is to use a current sensing module to implement current detection, and take the detected current as a basis for controlling power conversion. Therefore, the importance of the current sensing module is self-evident. However, during the operation process of the power conversion apparatus, since the current to be detected may flow backward due to switching of different operation modes, when the conventional current sensing module is applied to the power conversion apparatus, design of the negative power supply circuit and the bias circuit has to be considered, which causes difficulty in circuit design, and meanwhile a whole design cost of the power conversion apparatus is increased.

SUMMARY OF THE INVENTION

The invention is directed to a current sensing module and a power conversion apparatus and an electronic apparatus using the same, by which a bi-directional/AC current sensing mechanism is implemented without adding a negative power supply circuit and a bias circuit.

The invention provides a current sensing module adapted to detect a first load current flowing through a first load. The current sensing module includes a sampling stage circuit and an output stage circuit. The sampling stage circuit is coupled across the first load and selectively exchanges coupling nodes between the sampling stage circuit and the first load by applying a multiplex switching means according to a current direction of the first load current, so as to sample the first load current flowing along a first direction or a second direction, and thus generate a sampling signal. The output stage circuit is coupled to the sampling stage circuit and switches coupling nodes between the output stage circuit and an output terminals of the sampling stage circuit in collaboration with a switching timing of the sampling stage circuit, so as to generate a current indication signal for indicating a magnitude of the first load current according to the sampling signal.

In an embodiment of the invention, the sampling stage circuit includes a first multiplexer, a second multiplexer and a first amplifier. The first multiplexer has a plurality of input terminals and an output terminal, where a first input terminal in the input terminals of the first multiplexer is coupled to a first terminal of the first load, and a second input terminal in the input terminals of the first multiplexer is coupled to a second terminal of the first load, where the first multiplexer is controlled by a multiplexing signal to select a signal received by one of the first input terminal and the second input terminal thereof to serve as a first input signal. The second multiplexer has a plurality of input terminals and an output terminal, where a first input terminal in the input terminals of the second multiplexer is coupled to the second terminal of the first load, and a second input terminal in the input terminals of the second multiplexer is coupled to the first terminal of the first load, where the second multiplexer is controlled by the multiplexing signal to select a signal received by one of the first input terminal and the second input terminal thereof to serve as a second input signal. The first amplifier is coupled to the output terminals of the first and the second multiplexers for receiving the first and the second input signals, and accordingly generates the sampling signal.

In an embodiment of the invention, when the current direction of the first load current is the first direction, the first multiplexer is controlled by the multiplexing signal to select the signal received by the first input terminal thereof to serve as the first input signal, and the second multiplexer is controlled by the multiplexing signal to select the signal received by the first input terminal thereof to serve as the second input signal.

In an embodiment of the invention, when the current direction of the first load current is the second direction opposite to the first direction, the first multiplexer is controlled by the multiplexing signal to select the signal received by the second input terminal thereof to serve as the first input signal, and the second multiplexer is controlled by the multiplexing signal to select the signal received by the second input terminal thereof to serve as the second input signal.

In an embodiment of the invention, the output stage circuit includes a third multiplexer, a fourth multiplexer, a second amplifier, a first voltage-dividing unit and a second voltage-dividing unit. The third multiplexer has a plurality of input terminals and an output terminal, where a first input terminal in the input terminals of the third multiplexer is coupled to a first output terminal of the first amplifier, and a second input terminal in the input terminals of the third multiplexer is coupled to a second output terminal of the first amplifier, where the third multiplexer is controlled by the multiplexing signal to select a signal received by one of the first input terminal and the second input terminal thereof to serve as a third input signal. The fourth multiplexer has a plurality of input terminals and an output terminal, where the fourth multiplexer is controlled by the multiplexing signal to select coupling one of a first input terminal and a second input terminal in the input terminals thereof to the output terminal. The second amplifier is coupled to the output terminals of the third and the fourth multiplexers for receiving the third input signal, and accordingly generates the current indication signal. The first voltage-dividing unit is coupled between the first input terminal of the fourth multiplexer and a first output terminal of the second amplifier. The second voltage-dividing unit is coupled between the second input terminal of the fourth multiplexer and a second output terminal of the second amplifier.

In an embodiment of the invention, the current sensing module is further adapted to detect a second load current flowing through a second load, where a third input terminal in the input terminals of the first multiplexer is coupled to a first terminal of the second load, and a third input terminal in the input terminals of the second multiplexer is coupled to a second terminal of the second load.

In an embodiment of the invention, the first and the second multiplexers select to couple the two terminals of the first load for detecting the first load current during a first detection period, and select to couple the two terminals of the second load for detecting the second load current during a second detection period.

The invention provides a power conversion apparatus including a power conversion circuit, a current sensing module and a control circuit. The power conversion circuit is configured to convert an external power or a battery power into a working power for providing to a load apparatus, where the power conversion circuit has a first detection resistor coupled in series on a power conversion path. The current sensing module is coupled across the first detection resistor for detecting a first load current flowing through the first detection resistor. The control circuit is coupled to the power conversion circuit and the current sensing module, and is configured to control operations of the power conversion circuit and the current sensing module. The current sensing module includes a sampling stage circuit and an output stage circuit.

The sampling stage circuit is coupled across the first detection resistor and selectively exchanges coupling nodes between the sampling stage circuit and the first load by applying a multiplex switching means according to a current direction of the first load current, so as to sample the first load current flowing along a first direction or a second direction, and thus generate a sampling signal. The output stage circuit is coupled to the sampling stage circuit and switches coupling nodes between the output stage circuit and output terminals of the sampling stage circuit in collaboration with a switching timing of the sampling stage circuit, so as to generate a current indication signal indicating a magnitude of the first load current according to the sampling signal.

In an embodiment of the invention, the sampling stage circuit includes a first multiplexer, a second multiplexer and a first amplifier. The first multiplexer has a plurality of input terminals and an output terminal, where a first input terminal in the input terminals of the first multiplexer is coupled to a first terminal of the first detection resistor, and a second input terminal in the input terminals of the first multiplexer is coupled to a second terminal of the first detection resistor, where the first multiplexer is controlled by a multiplexing signal to select a signal received by one of the first input terminal and the second input terminal thereof to serve as a first input signal. The second multiplexer has a plurality of input terminals and an output terminal, where a first input terminal in the input terminals of the second multiplexer is coupled to the second terminal of the first detection resistor, and a second input terminal in the input terminals of the second multiplexer is coupled to the first terminal of the first detection resistor, where the second multiplexer is controlled by the multiplexing signal to select a signal received by one of the first input terminal and the second input terminal thereof to serve as a second input signal. The first amplifier is coupled to the output terminals of the first and the second multiplexers for receiving the first and the second input signals, and accordingly generates the sampling signal.

In an embodiment of the invention, the current sensing module is further adapted to detect a second load current flowing through a second detection resistor, where a third input terminal in the input terminals of the first multiplexer is coupled to a first terminal of the second detection resistor, and a third input terminal in the input terminals of the second multiplexer is coupled to a second terminal of the second detection resistor.

In an embodiment of the invention, the first and the second multiplexers select to couple the two terminals of the first detection resistor for detecting the first load current during a first detection period, and select to couple the two terminals of the second detection resistor for detecting the second load current during a second detection period.

The invention provides an electronic apparatus including a battery, a charging terminal and a power conversion circuit. The battery is configured to provide a battery power. The charging terminal is configured to receive an external power. The power conversion circuit is configured to convert the external power or the battery power into a working power for providing to a load apparatus, where the power conversion circuit has a first detection resistor connected in series on a power conversion path. The current sensing module is coupled across the first detection resistor for detecting a first load current flowing through the first detection resistor. The control circuit is coupled to the power conversion circuit and the current sensing module, and is configured to control operations of the power conversion circuit and the current sensing module. The current sensing module includes a sampling stage circuit and an output stage circuit. The sampling stage circuit is coupled across the first detection resistor and selectively exchanges coupling nodes between the sampling stage circuit and the first load by applying a multiplex switching means according to a current direction of the first load current, so as to sample the first load current flowing along a first direction or a second direction, and thus generate a sampling signal. The output stage circuit is coupled to the sampling stage circuit and switches coupling nodes between the output stage circuit and output terminals of the sampling stage circuit in collaboration with a switching timing of the sampling stage circuit, so as to generate a current indication signal indicating a magnitude of the first load current according to the sampling signal.

In an embodiment of the invention, the electronic apparatus further includes a load apparatus. The load apparatus is coupled to the power conversion apparatus and operates based on a working power provided by the power conversion apparatus.

According to the above descriptions, the embodiments of the invention provide a current sensing module and a power conversion apparatus and an electronic apparatus using the same. The current sensing module may adopt a multiplex switching means to implement measuring a bi-direction current without using a negative power and an additional reference power. Besides, the current sensing module may adopt a time-division multiplexing current sensing mechanism to implement multi-channel current sensing without additionally adding an amplifier to implement signal sampling and outputting, so as to decrease a design cost of the whole current sensing module.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
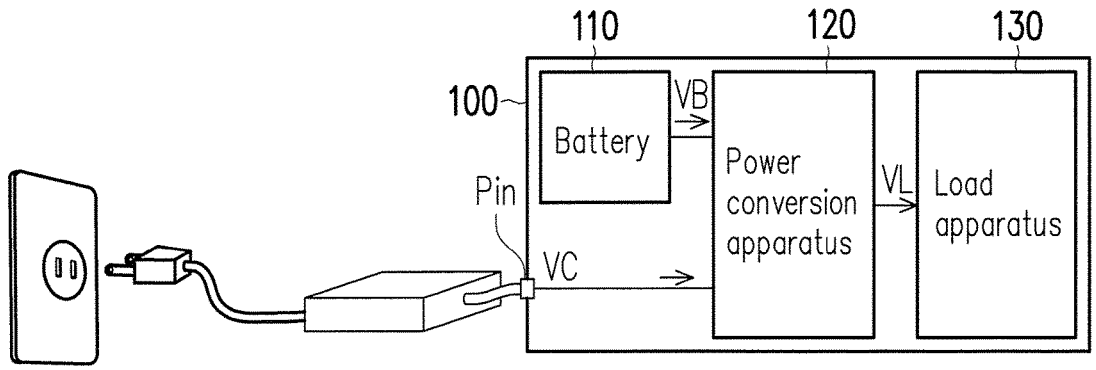
FIG. 1 is a schematic diagram of an electronic apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram of an electronic apparatus according to an embodiment of the invention. Referring to FIG. 1, the electronic apparatus 100 includes a charging terminal Pin, a battery 110, a power conversion apparatus 120 and a load apparatus 130. The electronic apparatus 100 is, for example, a notebook computer, a tablet personal computer (PC), a smart phone, a personal digital assistant (PDA) or a game machine, etc., which is not limited by the invention.

In an embodiment of the invention, the battery 110, the power conversion apparatus 120 and the load apparatus 130 are all disposed in internal of a casing of the electronic apparatus 100, and the charging terminal Pin is set on the casing. The charging terminal Pin of the electronic apparatus 100 is configured to receive an external power VC. The external power VC is, for example, an AC-DC converted commercial power output by a power converter. The battery 110 is configured to serve as a main power supply source of the electronic apparatus 100 when the external power VC is not connected to the electronic apparatus 100. When the electronic apparatus 100 is connected to the external power VC, the battery 110 is charged under control of the power conversion apparatus 120 based on the external power VC.

The power conversion apparatus 120 is coupled to the charging terminal Pin and the battery 110, and is configured to receive the external power VC and a battery power VB.

In case that the external power VC is connected to the charging terminal Pin, the power conversion apparatus 120 converts the external power VC into a working power VL required for operating the load apparatus 130, and a charging power is generated based on the external power VC and is provided to the battery 110 for charging the battery 110. On the other hand, in case that the external power VC is not connected to the charging terminal Pin, the power conversion apparatus 120 performs power conversion based on the battery power VB provided by the battery 110, so as to generate the working power VL required for operating the load apparatus 130.

The load apparatus 130 is coupled to the power conversion apparatus 120, and operates based on the working power VL provided by the power conversion apparatus 120 to provide a corresponding function of the electronic apparatus 100. For example, the load apparatus 130 can be a hardware part in the electronic apparatus 100 used for providing a specific function, which, for example, includes a central processing unit (CPU), a chipset, a memory, a hard disk, etc., and the type of the load apparatus is not limited by the invention.

Figure 2:
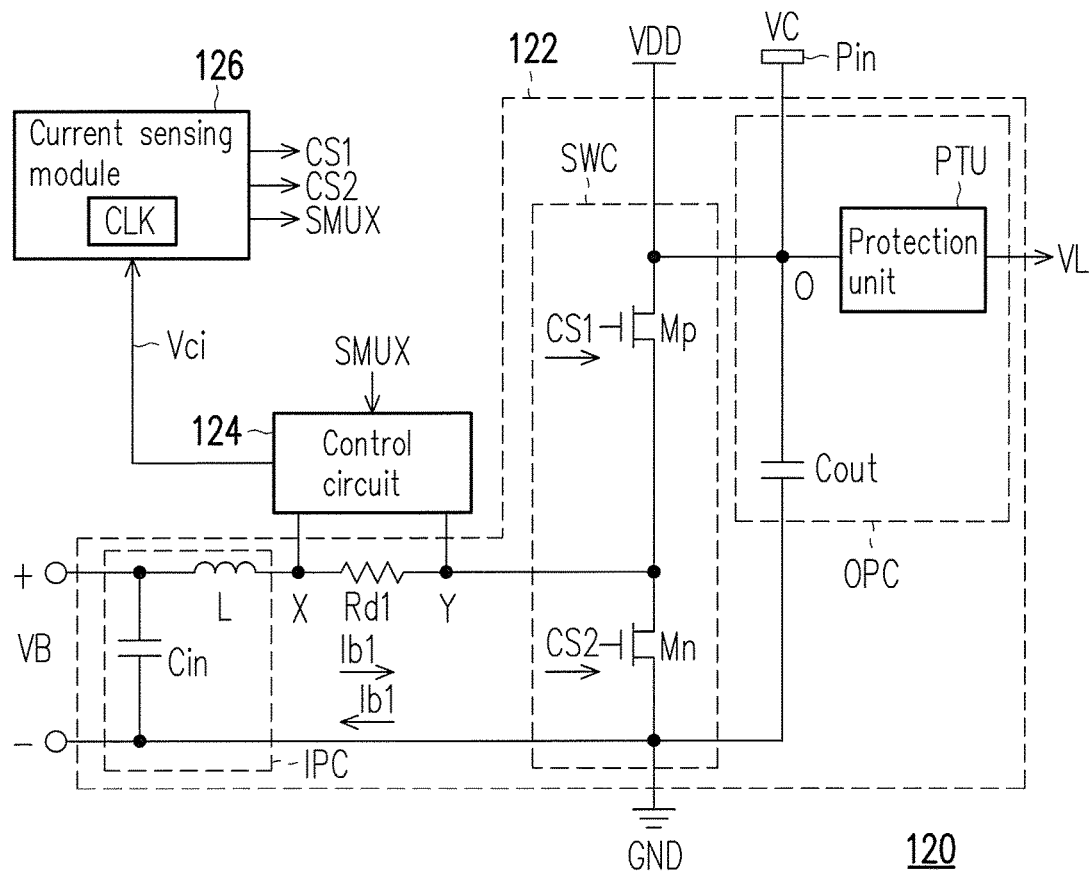
FIG. 2 is a schematic diagram of a power conversion apparatus according to an embodiment of the invention.

An exemplary structure of the power conversion apparatus 120 is shown in FIG. 2. FIG. 2 is a schematic diagram of a power conversion apparatus according to an embodiment of the invention. The power conversion apparatus is described below with reference of the structures shown in FIG. 1 and FIG. 2.

Referring to FIG. 1 and FIG. 2, the power conversion apparatus 120 applied to the electronic apparatus 100 includes a power conversion circuit 122, a current sensing module 124 and a control circuit 126.

The power conversion circuit 122 is configured to convert the external power

VC or the battery power VB into the working power VL for providing to the load apparatus 130, where the power conversion circuit 122 is, for example, a buck-boost converter, which includes an input circuit IPC, a switch circuit SWC and an output circuit OPC.

In the present embodiment, the input circuit IPC is, for example, composed of a capacitor Cin, an inductor L and a detection resistor Rd1 (though the invention is not limited thereto). Two ends of the capacitor Cin are coupled to the battery 110 for receiving the battery power VB. The inductor L and the detection resistor Rd1 are connected in series to form a power conversion path between the battery 110 and the switch circuit SWC.

The switch circuit SWC is, for example, composed of transistors Mp and Mn (though the invention is not limited thereto). The transistors Mp and Mn can be respectively a P-channel and an N-channel metal oxide semiconductor field effect transistors (MOSFET), though the invention is not limited thereto. The transistors Mp and Mn are connected in series between a power voltage VDD and a ground terminal GND, and switch conduction states thereof according to control signals CS1 and CS2 provided by the control circuit 126, so as to operate in a boost mode or a buck mode to implement power conversion.

The output circuit OPC is, for example, composed of a capacitor Cout and a protection unit PTU (though the invention is not limited thereto). One end of the capacitor Cout is coupled to the transistor Mp, the charging terminal Pin and an input terminal of the protection unit PTU through a node O, and another end of the capacitor Cout is coupled to the ground terminal GND. The protection unit PTU is used for limiting a voltage on the node O, and accordingly generates the working power VL.

The current sensing module 124 is coupled across the detection resistor Rd1 (i.e. coupled to a node X and a node Y), and is adapted to detect a load current Ib1 flowing through the detection resistor Rd1, and generates a current indication signal Vci indicating a magnitude of the load current Ib1 according to a detection result.

The control circuit 126 is coupled to the power conversion circuit 122 and the current sensing module 124, and generates the control signals CS1 and CS2 and a multiplexing signal SMUX to control operations of the power conversion circuit 122 and the current sensing module 124. The control circuit 126 adjusts the generated control signals CS1 and CS2 (for example, adjusts frequencies and/or duty cycles of the control signals CS1 and CS2, though the invention is not limited thereto) according to the current indication signal Vci indicating the magnitude of the load current Ib1, so as to modulate a power conversion behaviour of the power conversion circuit 122.

Regarding the power conversion operation of the power conversion apparatus 120, the control circuit 126 determines whether the external power VC is provided to the electronic apparatus 100 through the charging terminal Pin. When the control circuit 126 determines that the external power VC is not connected to the electronic apparatus 100, the control circuit 126 provides the corresponding control signals CS1 and CS2 to make the power conversion circuit 122 to operate in the boost mode.

In the boost mode, the power conversion circuit 122 takes the battery power VB as the input power to perform the power conversion, so as to generate the working voltage VL. Now, the load current Ib1 flows from the node X to the node Y (a direction from the node X to the node Y is defined as a first direction).

On the other hand, when the control circuit 126 determines that the external power VC is connected to the electronic apparatus 100, the control circuit 126 provides the corresponding control signals CS1 and CS2 to make the power conversion circuit 122 to operate in the buck mode.

In the buck mode, the power conversion circuit 122 takes the external power VC as the input power to perform the power conversion, so as to generate the working voltage VL and charge the battery 110. Now, the load current Ib1 flows from the node Y to the node X (a direction from the node Y to the node X is defined as a second direction).

Under the aforementioned power conversion mechanism, the load current Ib1 has different current directions (i.e. the first direction and the second direction opposite to the first direction) under different operation modes. In the conventional current sensing mechanism, a negative power has to be provided to implement the bi-directional current sensing. Otherwise, the current change on at least one direction cannot be detected, which leads to a control error of the power conversion.

Comparatively, the current sensing module 124 of the present embodiment can detect the load current Ib1 of different directions under different operation modes by applying a multiplex switching means according to the multiplexing signal SMUX provided by the control circuit 126 in case that the negative power is not applied, so as to implement the bi-directional/AC current sensing mechanism.

Figure 3:
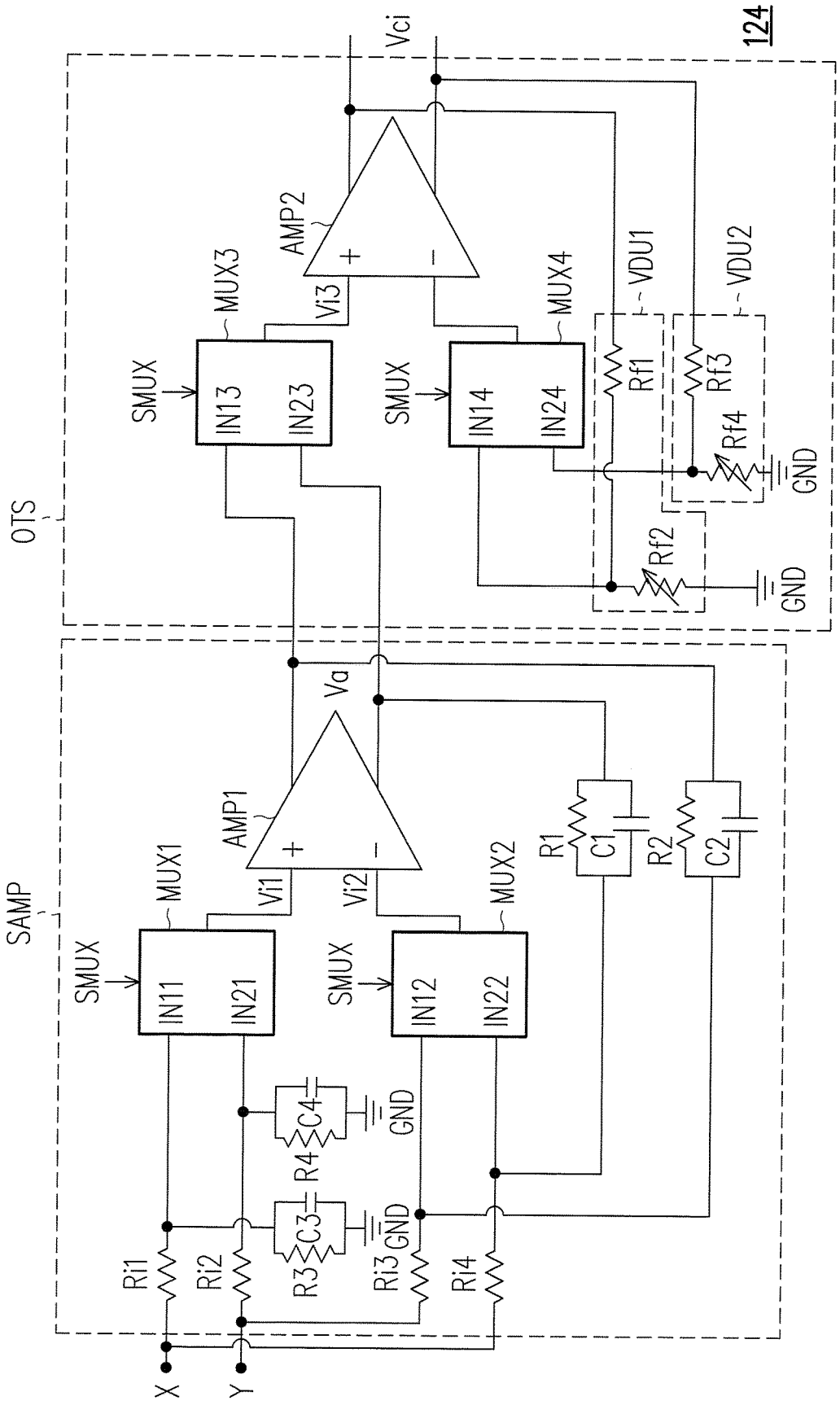
FIG. 3 is a schematic diagram of a current sensing module according to an embodiment of the invention.

A structure of the current sensing module 124 shown in FIG. 3 is provided to further describe the current sensing mechanism of the invention. FIG. 3 is a schematic diagram of the current sensing module according to an embodiment of the invention.

Referring to FIG. 2 and FIG. 3, in the present embodiment, the current sensing module 124 includes a sampling stage circuit SAMP and an output stage circuit OTS.

The sampling stage circuit SAMP is coupled across the detection resistor Rd1 (i.e. coupled to the node X and the node Y), and selectively exchanges coupling nodes between the sampling stage circuit SAMP and the detection resistor Rd1 by applying the multiplex switching means according to the current direction of the load current Ib1, so as to sample the load current Ib1 flowing along the first direction or the second direction to generate a sampling signal Va.

The output stage circuit OTS is coupled to the sampling stage circuit SAMP. The output stage circuit OTS switches coupling nodes between the output stage circuit OTS and output terminals of the sampling stage circuit SAMP in collaboration with a switching timing of the sampling stage circuit SAMP, so as to generate the current indication signal Vci indicating the magnitude of the load current Ib1 according to the sampling signal Va.

For example, when the control circuit 122 determines that the current direction of the load current Ib1 is the first direction, the sampling stage circuit SAMP couples a positive input terminal thereof to the node X and couples a negative input terminal thereof to the node Y in response to the multiplexing signal SMUX. Moreover, the output stage circuit OTS couples a positive input terminal thereof to a first output terminal of the sampling stage circuit SAMP and couples a negative input terminal thereof to a second output terminal of the sampling stage circuit SAMP in collaboration with switching of the sampling stage circuit SAMP according to the multiplexing signal SMUX.

On the other hand, when the control circuit 122 determines that the current direction of the load current Ib1 is the second direction, the sampling stage circuit SAMP couples the positive input terminal thereof to the node Y and couples the negative input terminal thereof to the node X in response to the multiplexing signal SMUX. Moreover, the output stage circuit OTS couples the positive input terminal thereof to the second output terminal of the sampling stage circuit SAMP and couples the negative input terminal thereof to the first output terminal of the sampling stage circuit SAMP in collaboration with switching of the sampling stage circuit SAMP according to the multiplexing signal SMUX.

To be specific, the sampling stage circuit SAMP includes multiplexers MUX1 and MUX2 and an amplifier AMP1, and the output stage circuit OTS includes multiplexers MUX3 and MUX4, an amplifier AMP2 and voltage-dividing units VDU1 and VDU2. Moreover, the sampling stage circuit SAMP further includes a peripheral circuit composed of resistors Ri1, Ri2, Ri3, Ri4, R1, R2, R3 and R4 and capacitors C1, C2, C3 and C4, and the voltage-dividing units VDU1 and VDU2 are, for example, composed of voltage-dividing resistors Rf1-Rf4, where the structures of the peripheral circuit and the voltage-dividing units VDU1 and VDU2 can be modified by a designer according to an actual design requirement, which are not limited by the invention.

In the sampling stage circuit SAMP of the present embodiment, the multiplexer MUX1 has a plurality of input terminals and an output terminal (for example, two input terminals IN11 and IN21, though the invention is not limited thereto). The input terminal IN11 of the multiplexer MUX1 is coupled to a first terminal (i.e. the node X) of the detection resistor Rd1 through the resistor Ri1, and the input terminal IN21 of the multiplexer MUX1 is coupled to a second terminal (i.e. the node Y) of the detection resistor Rd1 through the resistor Ri2, where the multiplexer MUX1 is controlled by the multiplexing signal SMUX to select a signal received by one of the input terminals IN11 and IN21 to serve as a first input signal Vi1.

Similarly, the multiplexer MUX2 has a plurality of input terminals and an output terminal (for example, two input terminals IN12 and IN22, though the invention is not limited thereto). The input terminal IN12 of the multiplexer MUX2 is coupled to the second terminal (i.e. the node Y) of the detection resistor Rd1 through the resistor Ri3, and the input terminal IN22 of the multiplexer MUX2 is coupled to the first terminal (i.e. the node X) of the detection resistor Rd1 through the resistor Ri4, where the multiplexer MUX2 is controlled by the multiplexing signal SMUX to select a signal received by one of the input terminals IN12 and IN22 to serve as a second input signal Vi2.

A positive input terminal and a negative input terminal of the amplifier AMP1 are respectively coupled to the output terminals of the multiplexers MUX1 and MUX2 to respectively receive the first input signal Vi1 and the second input signal Vi2, and the amplifier AMP1 respectively generates the sampling signal Va at a first output terminal and a second output terminal thereof. The first output terminal and the second output terminal of the amplifier AMP1 are two terminals extended from a same output terminal, so that the two output terminals have the same signal thereon.

In the design of the peripheral circuit of the present embodiment, the resistor Ri1 is coupled between the node X and the input terminal IN11 of the multiplexer MUX1, the resistor Ri2 is coupled between the node Y and the input terminal IN21 of the multiplexer MUX1, the resistor Ri3 is coupled between the node Y and the input terminal IN12 of the multiplexer MUX2, and the resistor Ri3 is coupled between the node X and the input terminal IN22 of the multiplexer MUX2. The resistor R1 is connected in parallel with the capacitor C1, one end of the resistor R1 and the capacitor C1 is coupled to the input terminal IN22 of the multiplexer MUX2, and another end of the resistor R1 and the capacitor C1 is coupled to the second output terminal of the amplifier AMP 1. The resistor R2 is connected in parallel with the capacitor C2, one end of the resistor R2 and the capacitor C2 is coupled to the input terminal IN12 of the multiplexer MUX2, and another end of the resistor R2 and the capacitor C2 is coupled to the first output terminal of the amplifier AMP 1. The resistor R3 is connected in parallel with the capacitor C3, one end of the resistor R3 and the capacitor C3 is coupled to the input terminal IN11 of the multiplexer MUX1, and another end of the resistor R3 and the capacitor C3 is coupled to the ground terminal GND. The resistor R4 is connected in parallel with the capacitor C4, one end of the resistor R4 and the capacitor C4 is coupled to the input terminal IN21 of the multiplexer MUX1, and another end of the resistor R4 and the capacitor C4 is coupled to the ground terminal GND.

In the output stage circuit OTS of the present embodiment, the multiplexer MUX3 has a plurality of input terminals and an output terminal (for example, two input terminals IN13 and IN23, though the invention is not limited thereto). The input terminal IN 13 of the multiplexer MUX3 is coupled to the first output terminal of the amplifier AMP1. The input terminal IN23 of the multiplexer MUX3 is coupled to the second output terminal of the amplifier AMP1, where the multiplexer MUX3 is controlled by the multiplexing signal SMUX to select a signal received by one of the input terminals IN13 and IN23 to serve as a third input signal Vi3 in synchronization with the multiplexers MUX1 and MUX2. For example, if the multiplexer MUX1 selects the signal received by the input terminal IN11 to serve as the first input signal Vi1 and the multiplexer MUX2 selects the signal received by the input terminal IN12 to serve as the second input signal Vi2, the multiplexer MUX3 correspondingly selects the signal (i.e. the sampling signal Va) received by the input terminal IN13 to serve as the third input signal Vi3; and if the multiplexer MUX1 selects the signal received by the input terminal IN21 to serve as the first input signal Vi1 and the multiplexer MUX2 selects the signal received by the input terminal IN22 to serve as the second input signal Vi2, the multiplexer MUX3 correspondingly selects the signal (i.e. the sampling signal Va) received by the input terminal 1N23 to serve as the third input signal Vi3.

The multiplexer MUX4 has a plurality of input terminals and an output terminal (for example, two input terminals IN14 and IN24, though the invention is not limited thereto). The multiplexer MUX4 is controlled by the multiplexing signal SMUX to select to couple one of the input terminals IN14 and IN24 to the output terminal in synchronization with the multiplexers MUX1, MUX2 and MUX3, and a detailed switching operation thereof is similar to that of the multiplexers MUX1-MUX3, which is not repeated.

A positive input terminal and a negative input terminal of the amplifier AMP2 are respectively coupled to the output terminals of the multiplexers MUX3 and MUX4, such that the input terminal of the amplifier AMP2 receive the third input signal Vi3, and the negative input terminal of the amplifier AMP2 is selectively coupled to the voltage-dividing unit VDU1 or the voltage-dividing unit VDU2, so as to produce the current indication signal Vci at a first output terminal and a second output terminal thereof. The first output terminal and the second output terminal of the amplifier AMP2 are two terminals extended from a same output terminal, so that the two output terminals have the same signal thereon.

In the voltage-dividing unit VDU1, the voltage-dividing resistor Rf1 is coupled between the input terminal IN14 of the multiplexer MUX4 and the first output terminal of the amplifier AMP2. The voltage-dividing resistor Rf2 is coupled between the input terminal IN14 of the multiplexer MUX4 and the ground terminal GND. In the voltage-dividing unit VDU2, the voltage-dividing resistor Rf3 is coupled between the input terminal IN24 of the multiplexer MUX4 and the second output terminal of the amplifier AMP2. The voltage-dividing resistor Rf4 is coupled between the input terminal IN24 of the multiplexer MUX4 and the ground terminal GND. The voltage-dividing resistors Rf2 and Rf4 are, for example, variable resistors, though the invention is not limited thereto.

Figure 4A:
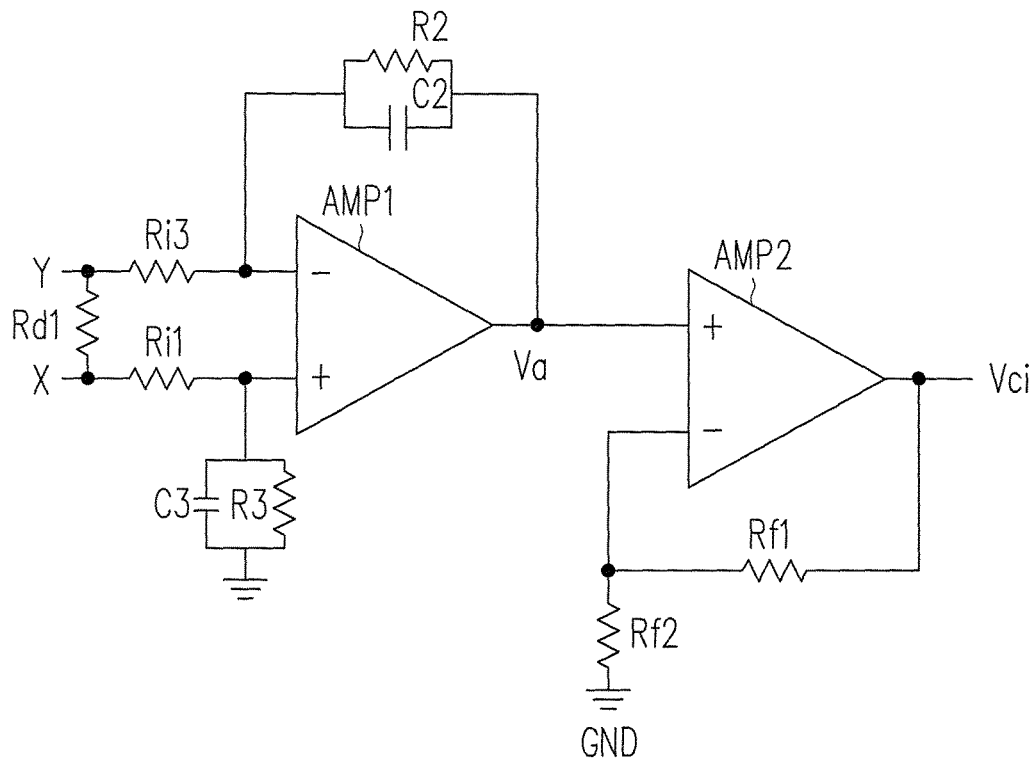
FIG. 4A is a schematic diagram of an equivalent circuit of the current sensing module of FIG. 3 under the boost mode according an embodiment of the invention.
Figure 4B:
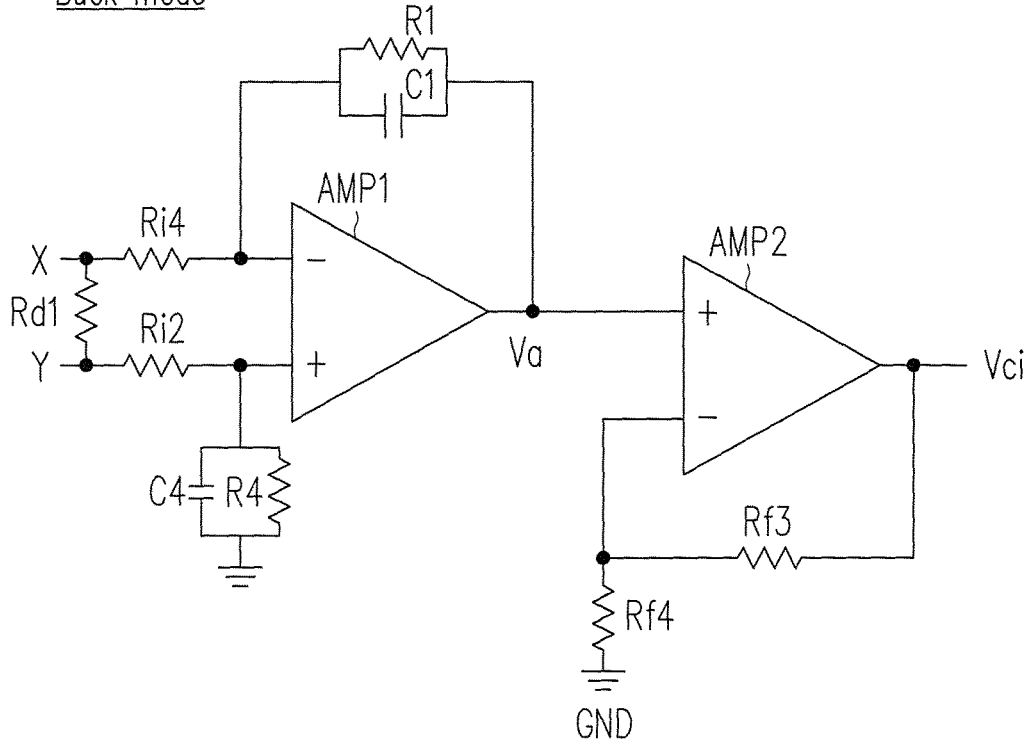
FIG. 4B is a schematic diagram of an equivalent circuit of the current sensing module of FIG. 3 under the buck mode according an embodiment of the invention.

An equivalent circuit structure of the current sensing module 124 is described below with reference of FIG. 4A and FIG. 4B. FIG. 4A is a schematic diagram of an equivalent circuit of the current sensing module of FIG. 3 under the boost mode according an embodiment of the invention. FIG. 4B is a schematic diagram of an equivalent circuit of the current sensing module of FIG. 3 under the buck mode according an embodiment of the invention.

Referring to FIG. 4A, under the boost mode, the multiplexer MUX1 is switched to provide the signal on the input terminal IN11 (i.e. the signal on the node X) to the positive input terminal of the amplifier AMP1, and the multiplexer MUX2 is switched to provide the signal on the input terminal IN12 (i.e. the signal on the node Y) to the negative input terminal of the amplifier AMP1. Under such configuration, the node X is equivalent to be coupled to the positive input terminal of the amplifier AMP1, and the node Y is equivalent to be coupled to the negative input terminal of the amplifier AMP1, and the resistors Ri2, Ri4, R1 and R4 and the capacitors C1 and C4 are equivalent to an open circuit.

The amplifier AMP1 performs differential amplification to the signals on the node X and the node Y to generate the sampling signal Va.

Moreover, under the boost mode, the multiplexer MUX3 is switched to provide the signal on the input terminal IN13 (i.e. the sampling signal Va) to the positive input terminal of the amplifier AMP2, and the multiplexer MUX4 is switched to couple the voltage-dividing resistors Rf1 and Rf2 of the voltage-dividing unit VDU1 to the negative input terminal of the amplifier AMP2. Under such configuration, the voltage-dividing unit VDU2 is equivalent to an open circuit, such that the amplifier AMP2 performs negative feedback amplification based on the sampling signal Va to generate the current indication signal Vci. The current indication signal Vci indicates a magnitude of the load current Ib1 of the first direction.

Referring to FIG. 4B, under the buck mode, the multiplexer MUX1 is switched to provide the signal on the input terminal IN21 (i.e. the signal on the node Y) to the positive input terminal of the amplifier AMP1, and the multiplexer MUX2 is switched to provide the signal on the input terminal IN22 (i.e. the signal on the node X) to the negative input terminal of the amplifier AMP 1. Under such configuration, the node X is equivalent to be coupled to the negative input terminal of the amplifier AMP1, and the node Y is equivalent to be coupled to the positive input terminal of the amplifier AMP1, and the resistors Ri1, Ri3, R2 and R3 and the capacitors C2 and C3 are equivalent to an open circuit. The amplifier AMP1 performs differential amplification to the signals on the node X and the node Y to generate the sampling signal Va.

Moreover, under the buck mode, the multiplexer MUX3 is switched to provide the signal on the input terminal IN23 (i.e. the sampling signal Va) to the positive input terminal of the amplifier AMP2, and the multiplexer MUX4 is switched to couple the voltage-dividing resistors Rf3 and Rf4 of the voltage-dividing unit VDU2 to the negative input terminal of the amplifier AMP2. Under such configuration, the voltage-dividing unit VDU1 is equivalent to an open circuit, such that the amplifier AMP2 performs negative feedback amplification based on the sampling signal Va to generate the current indication signal Vci. The current indication signal Vci indicates a magnitude of the load current Ib1 of the second direction.

According to the above mechanism, it is known that the positive input terminal and the negative input terminal of the amplifier AMP1 can be respectively equivalent to the positive input terminal and the negative input terminal of the sampling stage circuit SAMP. Similarly, the positive input terminal and the negative input terminal of the amplifier AMP2 can be respectively equivalent to the positive input terminal and the negative input terminal of the output stage circuit OTS.

Moreover, it should be noticed that the structure of the current sensing module of the present embodiment is not limited to be applied to the power conversion apparatus, which can also be applied to any occasion requiring the bi-directional/AC current sensing, and the power conversion apparatus applying the current sensing module is only an exemplary embodiment of the invention, and the invention is not limited thereto.

Figure 5:
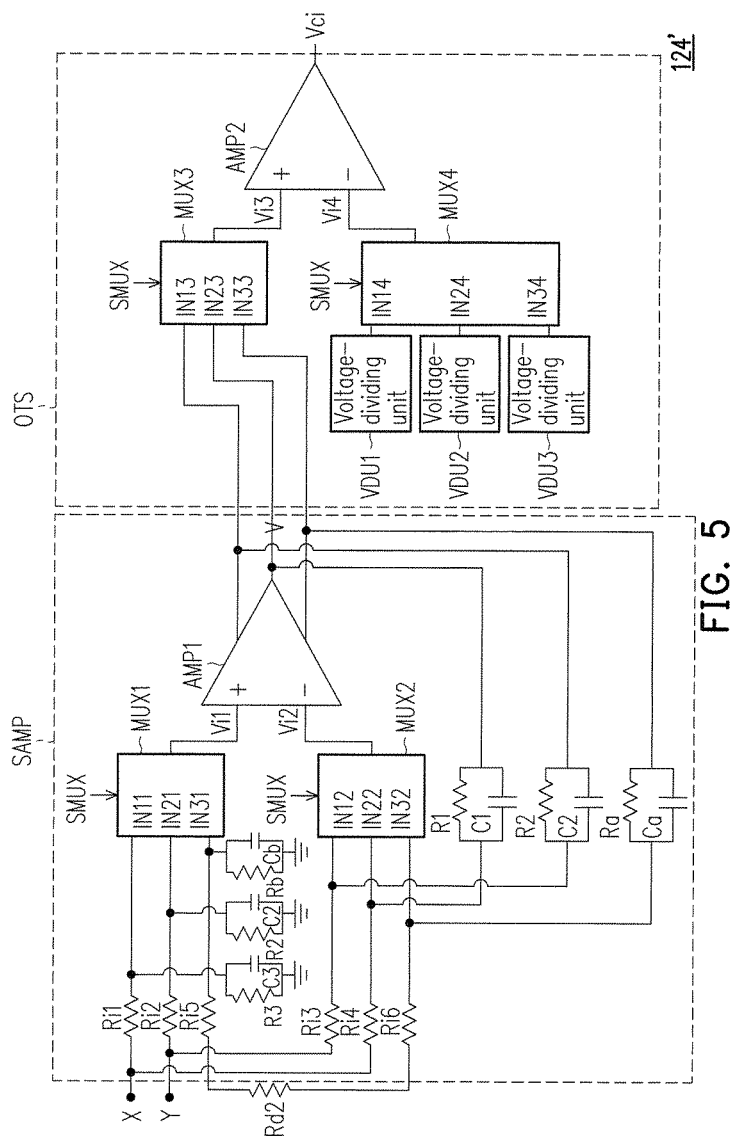
FIG. 5 is a schematic diagram of a current sensing module according to another embodiment of the invention.

FIG. 5 is a schematic diagram of a current sensing module according to another embodiment of the invention. Referring to FIG. 5, a design of the current sensing module 124' of the present embodiment is substantially the same to that of the current sensing module 124 of the embodiment of FIG. 3. A main difference between the present embodiment and the aforementioned embodiment is that the multiplexers MUX1-MUX4 in the current sensing module 124' further include input terminals IN31, IN32, IN33 and IN34. In this way, the current sensing module 124' of the present embodiment can implement multi-channel current sensing by using the same circuit structure according to a time-division multiplexing manner without adding any hardware equipment.

In detail, besides that the current sensing module 124' of the present embodiment can detect the load current Ib1 flowing through the detection resistor Rd1, the current sensing module 124' can further detect a magnitude of the load current Ib2 flowing through the detection resistor Rd2. The detection resistor Rd2 can be configured at any part in internal of the electronic apparatus 100 that requires to perform current sensing, and the configuration location is not limited by the invention.

In the present embodiment, the input terminal IN31 of the multiplexer MUX1 is coupled to a first terminal of the detection resistor Rd2, and the input terminal IN32 of the multiplexer MUX2 is coupled to a second terminal of the detection resistor Rd2. Moreover, the amplifier AMP1 of the present embodiment further includes a third output terminal (which is an extension of a same output terminal used for constructing the first and the second output terminals, and has the same signal with that of the first and the second output terminals). The input terminal IN33 of the multiplexer MUX3 is coupled to a third output terminal of the amplifier AMP1 for receiving the sampling signal Va. The input terminal IN34 of the multiplexer MUX4 is coupled to a voltage-dividing unit VDU3, where configuration of the voltage-dividing unit VDU3 is similar to that of the voltage-dividing units VDU1 and VDU2, which is not limited by the invention.

The sampling stage circuit SAMP of the present embodiment may include a peripheral circuit composed of resistors Ri1, Ri2, Ri3, Ri4, Ri5, Ri6, R1, R2, R3, R4, Ra and Rb and capacitors C1, C2, C3, C4, Ca and Cb. In the peripheral circuit of the present embodiment, configuration of the resistors Ri1-Ri4 and the capacitors C1-C4 is substantially the same with that of the embodiment of FIG. 3, and details thereof are not repeated. The resistor Ri5 of the present embodiment is coupled between the first terminal of the detection resistor Rd2 and the input terminal IN31 of the multiplexer MUX1, and the resistor Ri6 is coupled between the second terminal of the detection resistor Rd2 and the input terminal IN32 of the multiplexer MUX2. The resistor Ra and the capacitor Ca are connected in parallel, where one end of the resistor Ra and the capacitor Ca is coupled to the input terminal IN32 of the multiplexer MUX2, and another end of the resistor Ra and the capacitor Ca is coupled to the third output terminal of the first amplifier AMP1. One end of the resistor Rb and the capacitor Cb is coupled to the input terminal IN31 of the multiplexer MUX1, and another end of the resistor Rb and the capacitor Cb is coupled to the ground terminal GND.

Figure 6:
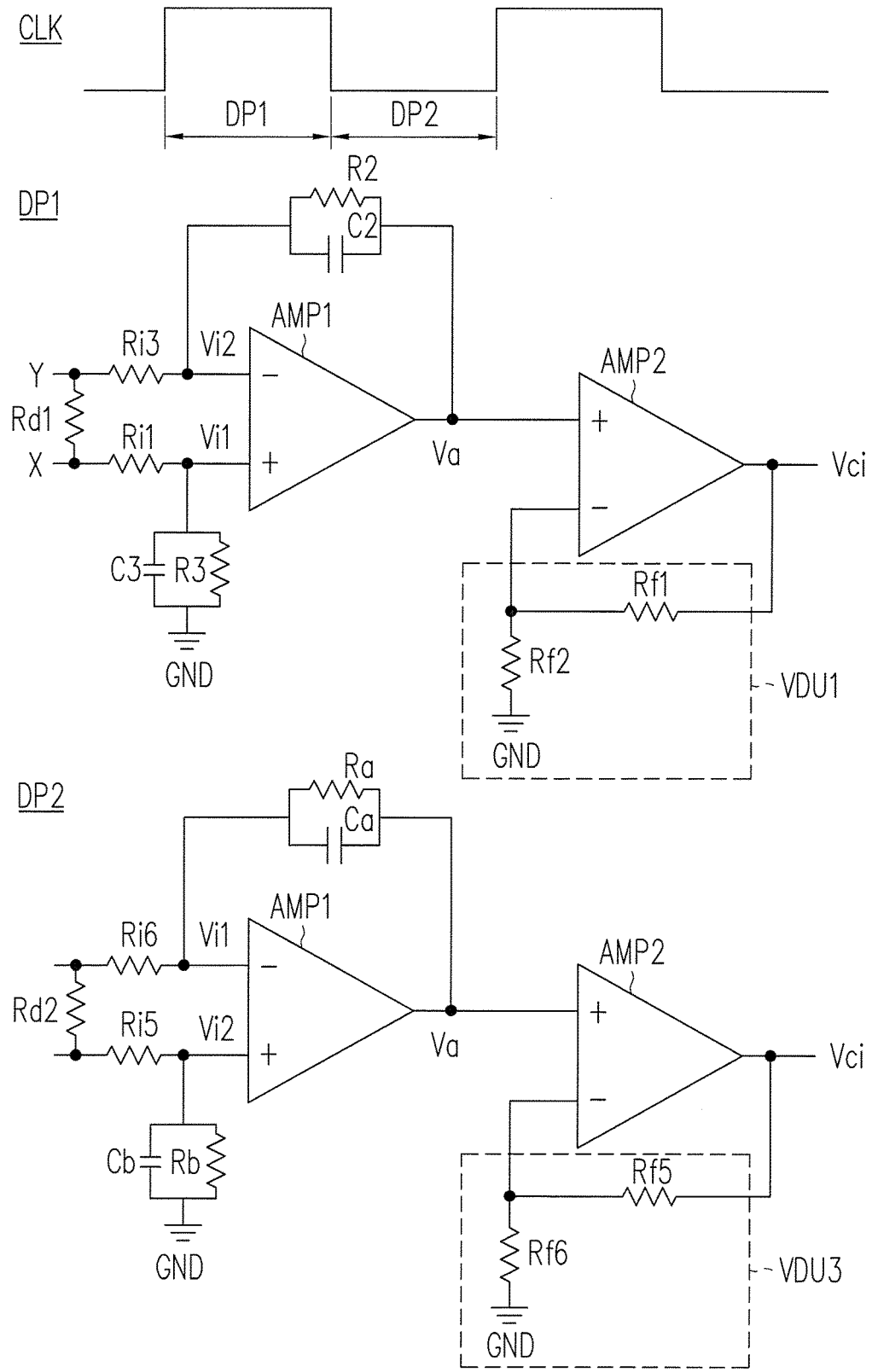
FIG. 6 is a schematic diagram illustrating a detection timing and an equivalent circuit of the current sensing module of FIG. 5 according to an embodiment of the invention.

A current sensing mechanism of the current sensing module 124' is described below with reference of FIG. 6. FIG. 6 is a schematic diagram illustrating a detection timing and an equivalent circuit of the current sensing module of FIG. 5 according to an embodiment of the invention.

Referring to FIG. 2, FIG. 5 and FIG. 6, for simplicity's sake, it is assumed that the power conversion apparatus 120 operates under the boost mode, though the invention is not limited thereto. In the present embodiment, the control circuit 126 determines a switching time point of the multiplexing signal SMUX according to an internal clock CLK, where a high level period of the internal clock CLK indicates a first detection period DP1, and a low level period of the internal clock CLK indicates a second detection period DP2 (though the invention is not limited thereto).

During the first detection period DP1, according to the operation method of the embodiment of FIG. 4A, the multiplexers MUX1 and MUX2 in the current sensing module 124' select to couple the two terminals of the detection resistor Rd1 in response to the multiplexing signal, and the multiplexers MUX3 and MUX4 are switched to a corresponding configuration in collaboration with the switching of the multiplexers MUX1 and MUX2, so as to detect the load current Ib1, and an equivalent schematic diagram and an operation mechanism thereof are shown in FIG. 4A, and details thereof are not repeated.

When the timing enters the second detection period DP2 from the first detection period DP1, the multiplexers MUX1 and MUX2 respectively switch the input terminals IN31 and IN32 to the corresponding output terminals, such that the positive input terminal and the negative input terminal of the amplifier AMP 1 are equivalent to be respectively coupled to the two terminals of the detection resistor Rd2, and the multiplexers MUX3 and MUX4 are switched to the input terminals IN33 and IN34 in collaboration with the switching of the multiplexers MUX1 and MUX2.

Under such circuit configuration, the first terminal of the detection resistor Rd2 is coupled to the positive input terminal of the amplifier AMP 1 through the resistor Ri5, the second terminal of the detection resistor Rd2 is coupled to the negative input terminal of the amplifier AMP1 through the resistor Rib, and the resistors Ri1-Ri4 and R1-R4 and the capacitors C1-C4 are equivalent to an open circuit. Moreover, the third output terminal of the amplifier AMP1 is coupled to the positive input terminal of the amplifier AMP2 for providing the sampling signal Va, and the voltage-dividing resistors Rf5 and Rf6 of the voltage-dividing unit VDU3 are coupled to the negative input terminal of the amplifier AMP2, and the voltage-dividing units VDU1 and VDU2 are equivalent to an open circuit, such that the amplifier AMP2 performs negative feedback amplification based on the sampling signal Va, and generates the current indication signal Vci indicating a magnitude of the load current Ib2.

According to the above descriptions, in the application that currents of multi-channel are required to be sensed, the input terminals of the multiplexers can be added to implement the current sensing without additionally adding an amplifier to implement signal sampling and outputting, by which a design cost of the whole current sensing module is decreased.

In summary, the embodiments of the invention provide a current sensing module and a power conversion apparatus and an electronic apparatus using the same.

The current sensing module may adopt a multiplex switching means to implement measuring a bi-direction current without using a negative power and an additional reference power. Besides, the current sensing module may adopt a time-division multiplexing current sensing mechanism to implement multi-channel current sensing without additionally adding an amplifier to implement signal sampling and outputting, so as to decrease a design cost of the whole current sensing module.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A current sensing module, adapted to detect a first load current flowing through a first load, the current sensing module comprising:
a sampling stage circuit, coupled across the first load, and configured to selectively exchange coupling nodes between the sampling stage circuit and the first load by applying a multiplex switching means according to a current direction of the first load current, so as to sample the first load current flowing along a first direction or a second direction, and thus generate a sampling signal; and
an output stage circuit, coupled to the sampling stage circuit, and switching coupling nodes between the output stage circuit and an output terminals of the sampling stage circuit in collaboration with a switching timing of the sampling stage circuit, so as to generate a current indication signal for indicating a magnitude of the first load current according to the sampling signal.

2. The current sensing module as claimed in claim 1, wherein the sampling stage circuit comprises:
a first multiplexer, having a plurality of input terminals and an output terminal, wherein a first input terminal in the input terminals of the first multiplexer is coupled to a first terminal of the first load, and a second input terminal in the input terminals of the first multiplexer is coupled to a second terminal of the first load, wherein the first multiplexer is controlled by a multiplexing signal to select a signal received by one of the first input terminal and the second input terminal thereof to serve as a first input signal;
a second multiplexer, having a plurality of input terminals and an output terminal, wherein a first input terminal in the input terminals of the second multiplexer is coupled to the second terminal of the first load, and a second input terminal in the input terminals of the second multiplexer is coupled to the first terminal of the first load, wherein the second multiplexer is controlled by the multiplexing signal to select a signal received by one of the first input terminal and the second input terminal thereof to serve as a second input signal; and
a first amplifier, coupled to the output terminals of the first and the second multiplexers for receiving the first and the second input signals, and accordingly generating the sampling signal.

3. The current sensing module as claimed in claim 2, wherein when the current direction of the first load current is the first direction, the first multiplexer is controlled by the multiplexing signal to select the signal received by the first input terminal thereof to serve as the first input signal, and the second multiplexer is controlled by the multiplexing signal to select the signal received by the first input terminal thereof to serve as the second input signal.

4. The current sensing module as claimed in claim 3, wherein when the current direction of the first load current is the second direction opposite to the first direction, the first multiplexer is controlled by the multiplexing signal to select the signal received by the second input terminal thereof to serve as the first input signal, and the second multiplexer is controlled by the multiplexing signal to select the signal received by the second input terminal thereof to serve as the second input signal.

5. The current sensing module as claimed in claim 2, wherein the output stage circuit comprises:

a third multiplexer, having a plurality of input terminals and an output terminal, wherein a first input terminal in the input terminals of the third multiplexer is coupled to a first output terminal of the first amplifier, and a second input terminal in the input terminals of the third multiplexer is coupled to a second output terminal of the first amplifier, wherein the third multiplexer is controlled by the multiplexing signal to select a signal received by one of the first input terminal and the second input terminal thereof to serve as a third input signal;

a fourth multiplexer, having a plurality of input terminals and an output terminal, wherein the fourth multiplexer is controlled by the multiplexing signal to select coupling one of a first input terminal and a second input terminal in the input terminals of the fourth multiplexer to the output terminal thereof;

a second amplifier, coupled to the output terminals of the third and the fourth multiplexers for receiving the third input signal, and accordingly generating the current indication signal;

a first voltage-dividing unit, coupled between the first input terminal of the fourth multiplexer and a first output terminal of the second amplifier; and a second voltage-dividing unit, coupled between the second input terminal of the fourth multiplexer and a second output terminal of the second amplifier.

6. The current sensing module as claimed in claim 2, further adapted to detect a second load current flowing through a second load, wherein a third input terminal in the input terminals of the first multiplexer is coupled to a first terminal of the second load, and a third input terminal in the input terminals of the second multiplexer is coupled to a second terminal of the second load.

7. The current sensing module as claimed in claim 6, wherein the first and the second multiplexers select to couple the two terminals of the first load for detecting the first load current during a first detection period, and select to couple the two terminals of the second load for detecting the second load current during a second detection period.

8. A power conversion apparatus, comprising:

a power conversion circuit, configured to convert an external power or a battery power into a working power for providing to a load apparatus, wherein the power conversion circuit has a first detection resistor coupled in series on a power conversion path;

a current sensing module, coupled across the first detection resistor for detecting a first load current flowing through the first detection resistor, wherein the current sensing module comprises:

a sampling stage circuit, coupled across the first detection resistor, and configured to selectively exchange coupling nodes between the sampling stage circuit and the first load by applying a multiplex switching means according to a current direction of the first load current, so as to sample the first load current flowing along a first direction or a second direction, and thus generate a sampling signal; and an output stage circuit, coupled to the sampling stage circuit, and switching coupling nodes between the output stage circuit and output terminals of the sampling stage circuit in collaboration with a switching timing of the sampling stage circuit, so as to generate a current indication signal indicating a magnitude of the first load current according to the sampling signal; and a control circuit, coupled to the power conversion circuit and the current sensing module, and configured to control operations of the power conversion circuit and the current sensing module.

9. The power conversion apparatus as claimed in claim 8, wherein the sampling stage circuit comprises:

a first multiplexer, having a plurality of input terminals and an output terminal, wherein a first input terminal in the input terminals of the first multiplexer is coupled to a first terminal of the first detection resistor, and a second input terminal in the input terminals of the first multiplexer is coupled to a second terminal of the first detection resistor, wherein the first multiplexer is controlled by a multiplexing signal to select a signal received by one of the first input terminal and the second input terminal thereof to serve as a first input signal;

a second multiplexer, having a plurality of input terminals and an output terminal, wherein a first input terminal in the input terminals of the second multiplexer is coupled to the second terminal of the first detection resistor, and a second input terminal in the input terminals of the second multiplexer is coupled to the first terminal of the first detection resistor, wherein the second multiplexer is controlled by the multiplexing signal to select a signal received by one of the first input terminal and the second input terminal thereof to serve as a second input signal; and a first amplifier, coupled to the output terminals of the first and the second multiplexers for receiving the first and the second input signals, and accordingly generating the sampling signal.

10. The power conversion apparatus as claimed in claim 9, wherein when the power conversion circuit operates in a boost mode, the power conversion circuit converts the battery power into the working power, the first multiplexer is controlled by the multiplexing signal to select the signal received by the first input terminal thereof to serve as the first input signal, and the second multiplexer is controlled by the multiplexing signal to select the signal received by the first input terminal thereof to serve as the second input signal.

11. The power conversion apparatus as claimed in claim 10, wherein when the power conversion circuit operates in a buck mode, the power conversion circuit converts the external power into the working power, the first multiplexer is controlled by the multiplexing signal to select the signal received by the second input terminal thereof to serve as the first input signal, and the second multiplexer is controlled by the multiplexing signal to select the signal received by the second input terminal thereof to serve as the second input signal.

12. The power conversion apparatus as claimed in claim 9, wherein the output stage circuit comprises:

a third multiplexer, having a plurality of input terminals and an output terminal, wherein a first input terminal in the input terminals of the third multiplexer is coupled to a first output terminal of the first amplifier, and a second input terminal in the input terminals of the third multiplexer is coupled to a second output terminal of the first amplifier, wherein the third multiplexer is controlled by the multiplexing signal to select a signal received by one of the first input terminal and the second input terminal thereof to serve as a third input signal;

a fourth multiplexer, having a plurality of input terminals and an output terminal, wherein the fourth multiplexer is controlled by the multiplexing signal to select coupling one of a first input terminal and a second input terminal in the input terminals of the fourth multiplexer to the output terminal thereof;
a second amplifier, coupled to the output terminals of the third and the fourth multiplexers for receiving the third input signal, and accordingly generating the current indication signal;
a first voltage-dividing unit, coupled between the first input terminal of the fourth multiplexer and a first output terminal of the second amplifier; and
a second voltage-dividing unit, coupled between the second input terminal of the fourth multiplexer and a second output terminal of the second amplifier.

13. The power conversion apparatus as claimed in claim 9, wherein the current sensing module is further adapted to detect a second load current flowing through a second detection resistor, wherein a third input terminal in the input terminals of the first multiplexer is coupled to a first terminal of the second detection resistor, and a third input terminal in the input terminals of the second multiplexer is coupled to a second terminal of the second detection resistor.

14. The power conversion apparatus as claimed in claim 13, wherein the first and the second multiplexers select to couple the two terminals of the first detection resistor for detecting the first load current during a first detection period, and select to couple the two terminals of the second detection resistor for detecting the second load current during a second detection period.

15. An electronic apparatus, comprising:
a battery, configured to provide a battery power;
a charging terminal, configured to receive an external power;
a power conversion apparatus, coupled to the battery and the charging terminal, wherein the power conversion apparatus comprises:
 a power conversion circuit, configured to convert the external power or the battery power into a working power, wherein the power conversion circuit has a first detection resistor connected in series on a power conversion path;
 a current sensing module, coupled across the first detection resistor for detecting a first load current flowing through the first detection resistor, wherein the current sensing module comprises:
  a sampling stage circuit, coupled across the first detection resistor, and configured to selectively exchange coupling nodes between the sampling stage circuit and the first load by applying a multiplex switching means according to a current direction of the first load current, so as to sample the first load current flowing along a first direction or a second direction, and thus generate a sampling signal; and
  an output stage circuit, coupled to the sampling stage circuit, and switching coupling nodes between the output stage circuit and output terminals of the sampling stage circuit in collaboration with a switching timing of the sampling stage circuit, so as to generate a current indication signal indicating a magnitude of the first load current according to the sampling signal; and
the control circuit, coupled to the power conversion circuit and the current sensing module, and configured to control operations of the power conversion circuit and the current sensing module.

16. The electronic apparatus as claimed in claim 15, further comprising:
a load apparatus, coupled to the power conversion apparatus, and operating based on a working power provided by the power conversion apparatus.

17. The electronic apparatus as claimed in claim 15, wherein the sampling stage circuit comprises:
a first multiplexer, having a plurality of input terminals and an output terminal, wherein a first input terminal in the input terminals of the first multiplexer is coupled to a first terminal of the first detection resistor, and a second input terminal in the input terminals of the first multiplexer is coupled to a second terminal of the first detection resistor, wherein the first multiplexer is controlled by a multiplexing signal to select a signal received by one of the first input terminal and the second input terminal thereof to serve as a first input signal;
a second multiplexer, having a plurality of input terminals and an output terminal, wherein a first input terminal in the input terminals of the second multiplexer is coupled to the second terminal of the first detection resistor, and a second input terminal in the input terminals of the second multiplexer is coupled to the first terminal of the first detection resistor, wherein the second multiplexer is controlled by the multiplexing signal to select a signal received by one of the first input terminal and the second input terminal thereof to serve as a second input signal; and
a first amplifier, coupled to the output terminals of the first and the second multiplexers for receiving the first and the second input signals, and accordingly generating the sampling signal.

18. The electronic apparatus as claimed in claim 17, wherein the control circuit further determines whether the external power is connected to the electronic apparatus through the charging terminal, and when the control circuit determines that the external power is not connected to the electronic apparatus, the control circuit controls the power conversion circuit to operate in a boost mode, and when the control circuit determines that the external power is connected to the electronic apparatus, the control circuit controls the power conversion circuit to operate in a buck mode.

19. The electronic apparatus as claimed in claim 18, wherein when the power conversion circuit operates in the boost mode, the power conversion circuit converts the battery power into the working power, the first multiplexer is controlled by the multiplexing signal to select the signal received by the first input terminal thereof to serve as the first input signal, and the second multiplexer is controlled by the multiplexing signal to select the signal received by the first input terminal thereof to serve as the second input signal.

20. The electronic apparatus as claimed in claim 19, wherein when the power conversion circuit operates in the buck mode, the power conversion circuit converts the external power into the working power, the first multiplexer is controlled by the multiplexing signal to select the signal received by the second input terminal thereof to serve as the first input signal, and the second multiplexer is controlled by the multiplexing signal to select the signal received by the second input terminal thereof to serve as the second input signal.

21. The electronic apparatus as claimed in claim 17, wherein the output stage circuit comprises:
a third multiplexer, having a plurality of input terminals and an output terminal, wherein a first input terminal in the input terminals of the third multiplexer is coupled to a first output terminal of the first amplifier, and a second input terminal in the input terminals of the third multiplexer is coupled to a second output terminal of the first amplifier, wherein the third multiplexer is controlled by the multiplexing signal to select a signal received by one of the first input terminal and the second input terminal thereof to serve as a third input signal;

a fourth multiplexer, having a plurality of input terminals and an output terminal, wherein the fourth multiplexer is controlled by the multiplexing signal to select coupling one of a first input terminal and a second input terminal in the input terminals to the output terminal thereof;

a second amplifier, coupled to the output terminals of the third and the fourth multiplexers for receiving the third input signal, and accordingly generating the current indication signal;

a first voltage-dividing unit, coupled between the first input terminal of the fourth multiplexer and a first output terminal of the second amplifier; and a second voltage-dividing unit, coupled between the second input terminal of the fourth multiplexer and a second output terminal of the second amplifier.

22. The electronic apparatus as claimed in claim 17, further comprising a second detection resistor dispose din the electronic apparatus, wherein the current sensing module is further adapted to detect a second load current flowing through the second detection resistor, a third input terminal in the input terminals of the first multiplexer is coupled to a first terminal of the second detection resistor, and a third input terminal in the input terminals of the second multiplexer is coupled to a second terminal of the second detection resistor.

23. The electronic apparatus as claimed in claim 22, wherein the first and the second multiplexers select to couple the two terminals of the first detection resistor for detecting the first load current during a first detection period, and select to couple the two terminals of the second detection resistor for detecting the second load current during a second detection period.

* * * * *